United States Patent
Aihara et al.

(10) Patent No.: US 6,859,036 B2
(45) Date of Patent: Feb. 22, 2005

(54) NMR ANALYZER

(75) Inventors: Katsuzou Aihara, Hitachiohta (JP); Michiya Okada, Mito (JP); Shigeru Kakugawa, Hitachi (JP); Hiroshi Morita, Hitachi (JP); Tsuyoshi Wakuda, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/315,215

(22) Filed: Dec. 10, 2002

(65) Prior Publication Data

US 2003/0210051 A1 Nov. 13, 2003

(30) Foreign Application Priority Data

May 8, 2002 (JP) ........................................ 2002-132254

(51) Int. Cl.[7] ................................................ G01V 3/00
(52) U.S. Cl. ........................................ 324/321; 324/319
(58) Field of Search ................................ 324/321, 318, 324/319, 307, 309, 320, 300, 312, 314; 335/216, 296; 62/47.1

(56) References Cited

U.S. PATENT DOCUMENTS 5,168,211 A    12/1992  Laukien et al.
5,319,333 A     6/1994  Roth et al.
5,739,689 A  *  4/1998  Roth et al. ................... 324/320
6,289,681 B1 *  9/2001  Eckels et al. ................. 62/47.1
6,570,475 B1 *  5/2003  Lvovsky et al. ............. 335/216

FOREIGN PATENT DOCUMENTS

EP         0 561 552 A    9/1993
JP         8 273923 A    10/1996

* cited by examiner

*Primary Examiner*—Louis Arana
(74) *Attorney, Agent, or Firm*—Dickstein Shapiro Morin & Oshinsky LLP

(57)  ABSTRACT

A first room-temperature space is formed penetrating through a cryostat along a center axis of a split-type multi-layer cylindrical superconducting coil system which has a ratio of the maximum empirical magnetic field to the central magnetic field of not larger than 1.3 and is horizontally arranged such that the center axis of the coil is in the horizontal direction, a room-temperature shim coil system is arranged in said first room-temperature space to improve the homogeneity of the magnetic field, a second room-temperature space is formed penetrating through the cryostat and passing through the center of said split gap in the vertical direction, and a sample to be measured and an NMR probe having a solenoid-type probe coil are inserted in said second room-temperature space. Further, the NMR analyzer has a new function constituted by a system for irradiating and detecting the electromagnetic waves having wavelengths of shorter than 0.1 mm.

10 Claims, 4 Drawing Sheets

NMR ANALYZER

BACKGROUND OF THE INVENTION

1. Field of the Invention

The present invention relates to an NMR analyzer.

2. Description of the Related Art

The NMR analyzer is an apparatus for evaluating and analyzing physical and chemical properties of a sample by placing the sample to be measured (to-be-measured sample) in a space of homogeneous static magnetic field, irradiating the to-be-measured sample with electromagnetic waves, and by utilizing the phenomenon of nuclear magnetic resonance that occurs.

A basic constitution of the NMR analyzer has been closely disclosed in a "Book of NMR", Yoji Arata, Maruzen Co., 2000. In general, the NMR analyzer is constituted by at least a superconducting magnet for generating a static magnetic field, a probe for emitting electromagnetic waves onto a sample and for receiving freely induced decay signals emitted from the sample, a high-frequency power source for feeding a high-frequency current to the probe, an amplifier for amplifying freely induced decay signals, a detector for detecting signals, and an analyzer for analyzing the signals detected by the detector. The probe is chiefly a saddle-type or a cage-type probe coil, and usually has a function for irradiating the sample with electromagnetic waves and a function for receiving signals emitted from the sample. Further, a multi-layer air-core solenoid is used as the superconducting magnet to generate a magnetic field in the vertical direction. The superconducting magnet must be cooled with liquid helium and is, hence, contained in a low-temperature container called cryostat. The to-be-measured sample is inserted from the upper side of the room-temperature space penetrating through the cryostat up and down, and the probe is inserted from the lower side thereof.

At present, a method of analyzing organic matters by utilizing the nuclear magnetic resonance has been rapidly developing. Concretely speaking, organic compounds such as proteins having complex molecular structures can be efficiently analyzed for their structures on an atomic level by setting the resonance frequency of protons to be not lower than 500 MHz and by establishing a central magnetic field of not smaller than 11.5 T by using strong superconducting magnets. In this case, a highly homogeneous magnetic field of not larger than 0.1 ppm is required at a sample position near the center. As a practical product, an apparatus of 900 MHz having a magnetic field intensity of 21.1 T has been placed in the market, and still efforts have been made to develop an apparatus of 1 GHz having a magnetic field intensity of 23.5 T.

The NMR analyzer must measure the proteins having complex molecular structures maintaining good sensitivity, and has so far been developed by simply increasing the intensity of magnetic field in which the sample is placed without changing the fundamental constitution of the apparatus.

However, an increase in the sensitivity is accompanied by an increase in the size of the apparatus. For example, the superconducting magnet becomes higher than 5 m and heavier than 5 tons. The bulky superconducting magnet generates leaking magnetic field of as long as 10 m and must be installed in a dedicated building. Besides, the to-be-measured sample and the probe must be loaded at the center of the magnetic field. With the bulky apparatus, however, this operation becomes a burden. For example, the probe is inserted from the lower side of the cryostat and, hence, a space of as wide as 2 m is necessary for the insertion. This further makes it necessary to place the cryostat on a rack causing the center of gravity of the apparatus to become high and making it difficult to suppress its own vibration to a sufficient degree. Further, an enhanced ability of the superconducting wires necessitates the cooling with superconducting helium and, hence, requires cumbersome maintenance and an increased cost for the maintenance.

As for the effect for improving the sensitivity relying upon the shape of the probe coil, it has heretofore been known that the sensitivity can be improved by about 1.5 to about 3 times if a solenoid coil is used as the probe coil bringing about various advantages as compared to those of the saddle type or the cage type as disclosed in the above "Book of NMR". For example, advantage is obtained concerning easy control of impedance, filling factor and efficiency of RF magnetic field. With the superconducting magnet that generates electric field in the vertical direction, however, the high-frequency pulse magnetic field must be emitted to the sample in the horizontal direction. Therefore, it is practically difficult to wind the solenoid coil around the sample tube which is filled with a proteinaceous aqueous solution and is oriented in the vertical direction. Therefore, this superconducting magnet has not been generally used.

SUMMARY OF THE INVENTION

It is therefore an object of the invention to provide a high-resolution NMR analyzer which can be favorably installed, excellently operated and is compact in size.

In order to solve the above object of the invention, the invention employs the following measures.

A first measure is concerned with an NMR analyzer comprising a split-type multi-layer cylindrical superconducting coil system horizontally arranged in a cryostat, a first space formed penetrating through the split-type multi-layer cylindrical superconducting coil system, and a second space formed in the split gap.

A second measure is concerned with the first measure, wherein a ratio of the maximum empirical magnetic field to the central magnetic field is not larger than 1.3.

A third measure is concerned with the first measure, further having a shim coil arranged in the second space.

A fourth measure is concerned with an NMR analyzer comprising a split-type multi-layer cylindrical superconducting coil system horizontally arranged in a cryostat, a first space formed penetrating through the split-type multi-layer cylindrical superconducting coil system, a second space formed in the split gap, and a third space intersecting the second space.

A fifth measure is concerned with an NMR analyzer wherein a first room-temperature space is formed penetrating through a cryostat along a center axis of a split-type multi-layer cylindrical superconducting coil system which has a ratio of the maximum empirical magnetic field to the central magnetic filed of not larger than 1.3 and is horizontally arranged such that the center axis of the coil is in the horizontal direction, a room-temperature shim coil system is arranged in the first room-temperature space to improve the homogeneity of the magnetic field, a second room-temperature space is formed penetrating through the cryostat and passing through the center of the split gap in the vertical direction, and a sample to be measured and an NMR probe having a solenoid-type probe coil are inserted in the second room-temperature space. This makes it possible to provide an NMR analyzer which features high sensitivity, high precision and which can be favorably installed.

A sixth measure is concerned with an NMR analyzer wherein a first room-temperature space is formed penetrating through a cryostat along a center axis of a split-type multi-layer cylindrical superconducting coil system which has a ratio of the maximum empirical magnetic field to the central magnetic filed of not larger than 1.3 and is horizontally arranged such that the center axis of the coil is in the horizontal direction, a room-temperature shim coil system is arranged in the first room-temperature space to improve the homogeneity of the magnetic field, a second room-temperature space is formed penetrating through the cryostat and passing through the center of the split gap in the vertical direction, a sample to be measured is inserted in the second room-temperature space, a third room-temperature space is formed penetrating through the cryostat and intersecting the first room-temperature space at right angles thereto, and an NMR probe having a solenoid-type probe coil is arranged in the space.

A seventh measure is concerned with an NMR analyzer wherein a first room-temperature space is formed penetrating through a cryostat along a center axis of a split-type multi-layer cylindrical superconducting coil system which has a ratio of the maximum empirical magnetic field to the central magnetic filed of not larger than 1.3 and is horizontally arranged such that the center axis of the coil is in the horizontal direction, a room-temperature shim coil system is arranged in the first room-temperature space to improve the homogeneity of the magnetic field, a second room-temperature space is formed penetrating through the cryostat and passing through the center of the split gap in the vertical direction, and a sample to be measured and an NMR probe having a solenoid-type probe coil are inserted in the second room-temperature space, wherein the first room-temperature space is further provided with a system for irradiating electromagnetic waves of wavelengths of not loner than 0.1 mm.

An eighth measure is concerned with an NMR analyzer wherein a first room-temperature space is formed penetrating through a cryostat along a center axis of a split-type multi-layer cylindrical superconducting coil system which has a ratio of the maximum empirical magnetic field to the central magnetic field of not larger than 1.3 and is horizontally arranged such that the center axis of the coil is in the horizontal direction, a room-temperature shim coil system is arranged in the first room-temperature space to improve the homogeneity of the magnetic field, a second room-temperature space is formed penetrating through the cryostat and passing through the center of the split gap in the vertical direction, a sample to be measured and an NMR probe having a solenoid-type probe coil are inserted in the second room-temperature space, and a third room-temperature space is formed penetrating through the cryostat and intersecting the first room-temperature space at right angles thereto.

A ninth measure is concerned with the fifth to eighth measures, wherein the third room-temperature space is provided with a system for irradiating electromagnetic waves having wavelengths of not larger than 0.1 mm, or with a system for irradiating electromagnetic waves having wavelengths of not larger than 0.1 mm and with an electromagnetic wave detection system.

A tenth measure is concerned with the fifth to ninth measures, wherein the magnetic field at the center of the coil is not smaller than 11.5 T.

An eleventh measure is concerned with the first to tenth measures, wherein the total height of the apparatus is not larger than 2.0 m.

A twelfth measure is concerned with the seventh or ninth measure, wherein the electromagnetic waves are any one kind of, or a plurality of kinds of, far infrared rays, infrared rays, visible rays, ultraviolet rays, X-rays and γ-rays.

A thirteenth measure is concerned with the fifth to twelfth measures, wherein the distance along the center axis is not larger than 1.5 m between the floor surface and the split-type multi-layer cylindrical superconducting coil system horizontally arranged in a manner that the center axis of the coil thereof is in the horizontal direction.

In order to generate a horizontal magnetic field, the invention uses the split-type multi-layer cylindrical superconducting magnet that is horizontally arranged. To generate an intense magnetic field, the coil is formed in a multiplicity of layers, the outer layers being formed by winding an NbTi wire and the inner layers being formed by winding an $Nb_3Sn$ wire having excellent intense magnetic field characteristics. Usually, several kinds of wires are used depending upon the magnetic field characteristics. Since the cylindrical coil having an axial length greater than the diameter thereof is horizontally arranged, the height of the apparatus can be suppressed to be not larger than one-half compared to the height of the apparatus which is vertically arranged. The split-type is employed in order to insert the sample and the probe in the center of the magnetic field. Here, if the split gap is great, the magnetic field is generated at a decreased efficiency at the center, and a maximum empirical magnetic field of the superconducting coil increases. In the invention, the ratio of the maximum empirical magnetic field and the central magnetic field in this case is desirably set to be not larger than 1.3. In the split coil, a tremendously large electromagnetic force acts among the coils in the direction of compression. Therefore, the split gap must be of a structure that withstands the electromagnetic force, and forming a too large space is not desirable.

The superconducting magnet in the NMR analyzer must have a magnetic field homogeneity of as high as 0.1 ppm or smaller in the sample space of a diameter of 10 to 20 mm. Therefore, a superconducting shim coil system is arranged on the outer peripheral side together with the arrangement of the combined coil. Further, the time stability must be as high as 0.01 ppm/h or smaller. Therefore, the coils are constituting a so-called permanent current coil in which superconducting wires are connected to each other in a superconducting manner.

The NMR probe uses a solenoid-type probe coil which, in the invention, can be inserted from the lower side of the room-temperature space that is penetrating through up and down. Since the apparatus is horizontally arranged, the distance from the lower end of the cryostat to the center of the magnetic field is suppressed to be not larger than 1 m, facilitating the insertion. Besides, no particular attention needs be paid to the distance between the lower end of the cryostat and the surface of the floor. In the invention, further, the room-temperature space may be constituted from the side of the cryostat, and the probe may be inserted from the horizontal direction. Here, no space for access is required between the lower end of the cryostat and the floor surface, and the height of the apparatus can be further decreased. Even when inserted in the horizontal direction, the solenoid-type probe coil has a solenoid axis which is at right angles with the direction of the magnetic field.

The NMR analyzer of the invention has a decreased height facilitating the operation for replacing the samples.

Another feature of the horizontally arranged type is that the height of the ceiling of the building can be suppressed to be from about 2.5 to about 3 m. Since the center of gravity exists at a low position, a countermeasure can be easily taken against oscillation due to earthquake. It can therefore be that the NMR analyzer can be favorably installed.

In the invention, further, a plurality of access ports can be easily provided. Therefore, the NMR analyzer is not limited to the traditional functions only but offers a multiplicity of functions in the study of mutual action among the proteins and chemical reactions, enabling the samples to be easily irradiated with electromagnetic waves such as light and X-rays.

DESCRIPTION OF THE PREFERRED EMBODIMENTS (Embodiment 1)

Figure 1:
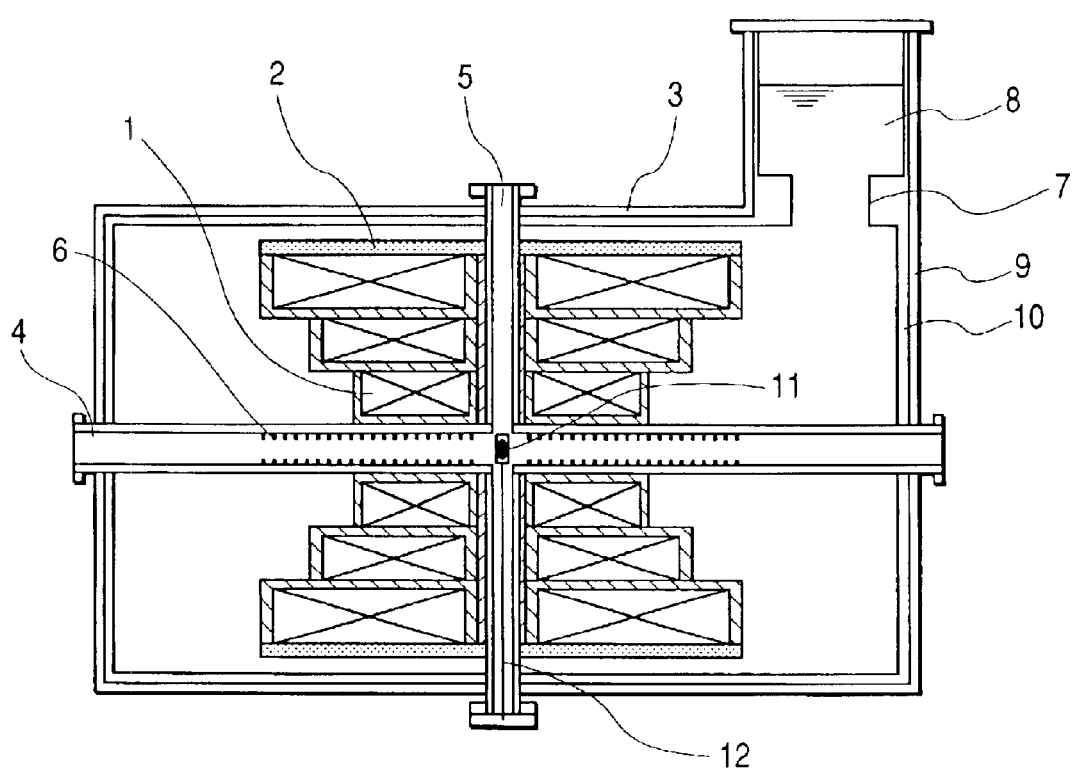
FIG. 1 is a sectional view illustrating the basic constitution of an MNR analyzer according to Embodiment 1 of the invention.

FIG. 1 is a sectional view illustrating the constitution of an NMR analyzer according to Embodiment 1. The NMR analyzer of this Embodiment 1 includes a cryostat 3 which comprises a liquid helium vessel 7, a heat-shielding plate 10, a vacuum vessel 9 and a liquid helium reservoir provided at an upper portion; and a split-type multi-layer cylindrical superconducting coil system 1 horizontally arranged in the cryostat. The cryostat 3 itself is installed on an oscillation-proof rack, and the split-type cylindrical superconducting coil system 1 is secured in the cryostat 3 by using a load support that permits the infiltration of little heat. The cryostat without the liquid helium reservoir has an outer diameter of about 1000 mm and a length of about 1200 mm. The liquid helium reservoir has a height of 500 mm. Under the cryostat, a space of about 800 mm is provided for inserting the NMR probe. Therefore, the overall height of the cryostat from the surface of the floor is 2500 mm. The split-type multi-layer cylindrical superconducting coil system 1 has an inner diameter of 70 mm, an outer diameter of 600 mm, and the axial length thereof is 1000 mm inclusive of a superconducting connection portion at the end of the coil. The split-type cylindrical superconducting coil system 1 weighs about 0.9 tons, and the total weight of the NMR analyzer inclusive of the oscillation-proof rack is about 1.8 tons. The magnetic field that is generated is 14.1 T at the center, and a maximum empirical magnetic field is 17.2 T.

The split-type multi-layer cylindrical superconducting coil system 1 has an outer layer of an NbTi wire, an intermediate layer of a highly withstanding $Nb_3Sn$ wire and an inner layer of a high-magnetic-field $Nb_3Sn$ wire, which are wound in the form of coils. Though FIG. 1 shows three layers in a simplified manner, each of them is further divided into two layers. Therefore, there is constituted a multi-layer coil of a total of six layers. The split gap is 100 mm.

A superconducting shim coil system 2 is arranged on the outer side of the superconducting coil system 1 and is entirely immersed in liquid helium 8.

A first room-temperature space 4 is formed penetrating through the cryostat 3 along the center axis of the split-type multi-layer cylindrical superconducting coil system 1. The first room-temperature space 4 has a room-temperature space diameter of 50 mm, employs a vacuum adiabatic structure, and is secured by welding to the cryostat 3. In the first room-temperature space 4 is further arranged a room-temperature shim coil system 6 for improving the homogeneity in the magnetic field.

In a direction (up-and-down direction on the surface of the paper in FIG. 1) perpendicular to the center axis, further, a second room-temperature space 5 is formed penetrating through the cryostat 3 passing the center of split gap of the split-type multi-layer cylindrical superconducting coil system 1. The second room-temperature space 5 has a room-temperature space diameter of 50 mm, and is arranged nearly at the center of the cryostat 3 in the direction of length so as to be vertically oriented up and down.

The first room-temperature space 4 and the second room-temperature space 5 are intersecting at a central position of the superconducting coil system 1, and are welded to each other to maintain vacuum adiabatic performance. A to-be-measured sample is arranged in the intersecting space. For example, the to-be-measured sample 11 and an NMR probe 12 having a solenoid-type probe coil are inserted in the space where the first room-temperature space 4 and the second room-temperature space 5 of FIG. 1 intersect each other. Here, the room-temperature shim coil system 6 inserted and arranged in the first room-temperature space has been specially contrived to maintain the homogeneity of magnetic field in the central region of the magnetic field to where the sample is set. Namely, in this application which uses the split-type superconducting coil and in which the second room-temperature space 5 is intersecting thereto at right angles, the coil wiring at the center of the room-temperature shim coil system 6 is so contrived as will not to interrupt the insertion of the NMR probe 12 from the lower side. Further, the NMR probe 12 inserted in the second room-temperature space 5 has a solenoid-type probe coil, the center axis of solenoid of the probe coil being in the vertical direction, i.e., the direction of magnetic field thereof being in the horizontal direction, so that the two meet at right angles with each other.

The NMR analyzer of this Embodiment 1 has a proton resonance frequency of 600 MHz. However, use of the probe coil of the type of solenoid coil helps improve the SN sensitivity by about 1.5 times as compared to the conventional vertical-type 600 MHz apparatus. This means that the sensitivity is equivalent to that of the conventional 900 MHz NMR analyzer and, besides, the weight and the height of the apparatus are both decreased to one-half or smaller, accomplishing a compact size.

As described above, the NMR analyzer of the invention offers excellence in the installation and operation.

(Embodiment 2)

Figure 2:
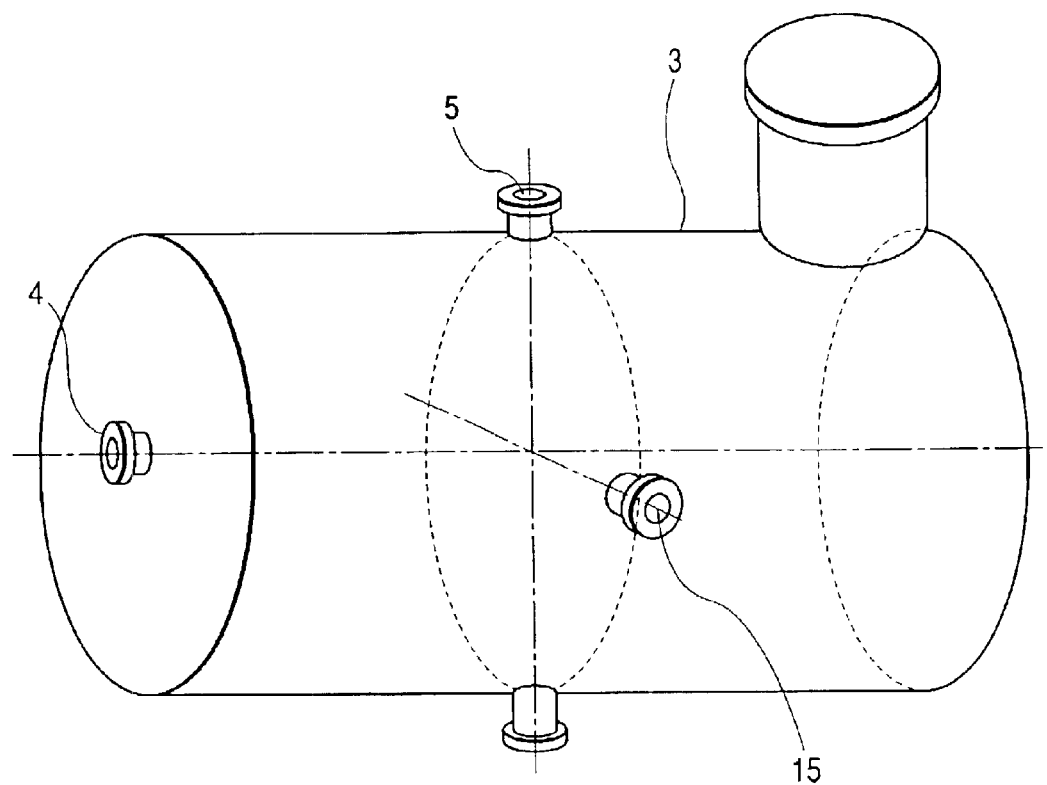
FIG. 2 is a view showing the appearance of the NMR analyzer according to Embodiment 2 of the invention.

FIG. 2 shows the appearance of the NMR analyzer according to Embodiment 2. In this Embodiment 2, the constitution of Embodiment 1 is further provided with a third room-temperature space 15 so as to intersect the first room-temperature space 4 and the second room-temperature space 5 at right angles. In Embodiment 1, the NMR probe is inserted in the second room-temperature space 5 from the lower side. In this Embodiment 2, however, the NMR probe can be inserted from the horizontal direction by using the third room-temperature space 15. The NMR probe that is used is the solenoid-type probe coil, the solenoid axis being vertically oriented. The to-be-measured sample is inserted in the second room-temperature space 5 from the upper side, and the room-temperature shim system is incorporated in the first room-temperature space 4.

In this Embodiment 2, no access is necessary from the lower side of the second room-temperature space 5, and space can be omitted between the cryostat 3 and the oscillation proof rack enabling the overall height of the apparatus to be lowered down to 1700 mm. This makes it possible to improve the operability of the NMR probe, to improve the operability such as of replacing the samples, and to facilitate the installation with respect to the height of the ceiling.

(Embodiment 3)

Figure 3:
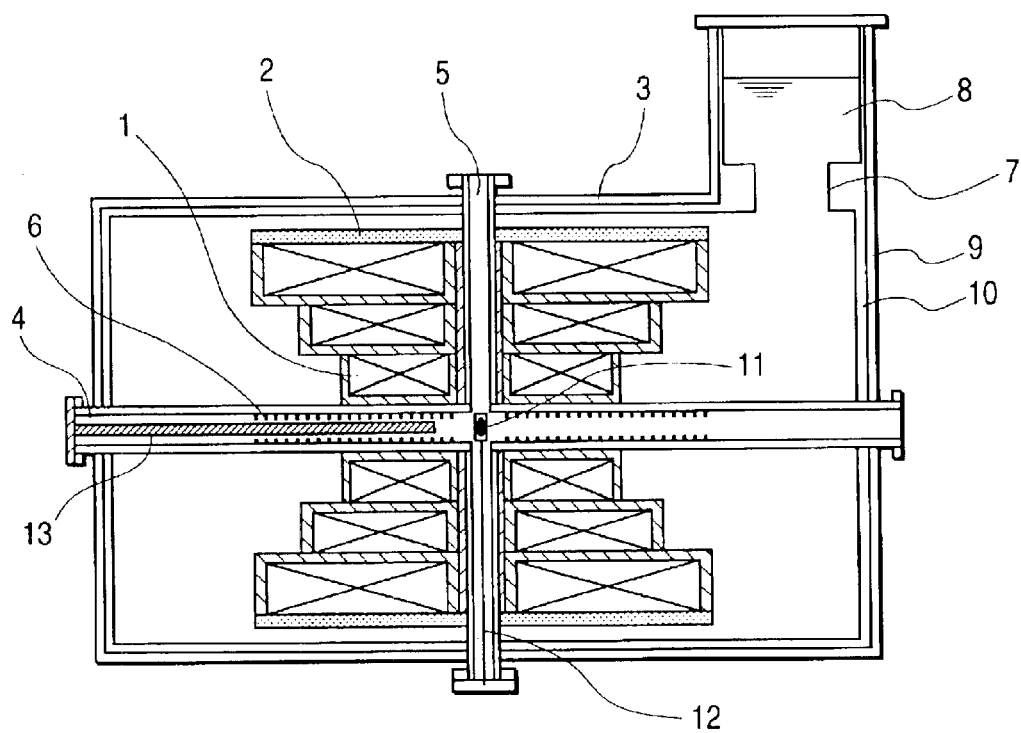
FIG. 3 is a sectional view illustrating the basic constitution of the NMR analyzer according to Embodiment 3 of the invention.

FIG. 3 is a sectional view illustrating the constitution of the NMR analyzer according to Embodiment 3. In this Embodiment 3, the NMR analyzer fabricated in Embodiment 1 is further provided with a system 13 for irradiating electromagnetic waves of wavelengths of smaller than 0.1 mm in the first room-temperature space 4 as a novel function.

There are still many uncertainties concerning the mutual reactions and chemical reactions of proteins, and the study must be conducted in the future from a variety of viewpoints. Here, it is important to let the effects of electromagnetic waves such as light and X-rays be known. By using the NMR apparatus of this Embodiment 3, the electromagnetic wave irradiation system can be easily incorporated and used. The electromagnetic waves to be used may include far infrared rays of wavelengths of 0.1 mm or shorter through up to visible light rays, X-rays and γ-rays. Relying upon this constitution, the NMR apparatus according to Embodiment 3 enables the first room-temperature space or the third room-temperature space to be provided with the mechanism for irradiating and detecting electromagnetic waves of wavelengths of shorter than 0.1 m.

As described above, operability of the NMR probe is improved, operability such as replacing the samples is improved and installation is improved concerning the height of the ceiling. According to the NMR analyzer of this Embodiment 3, further, access ports can be easily added.

(Embodiment 4)

Figure 4:
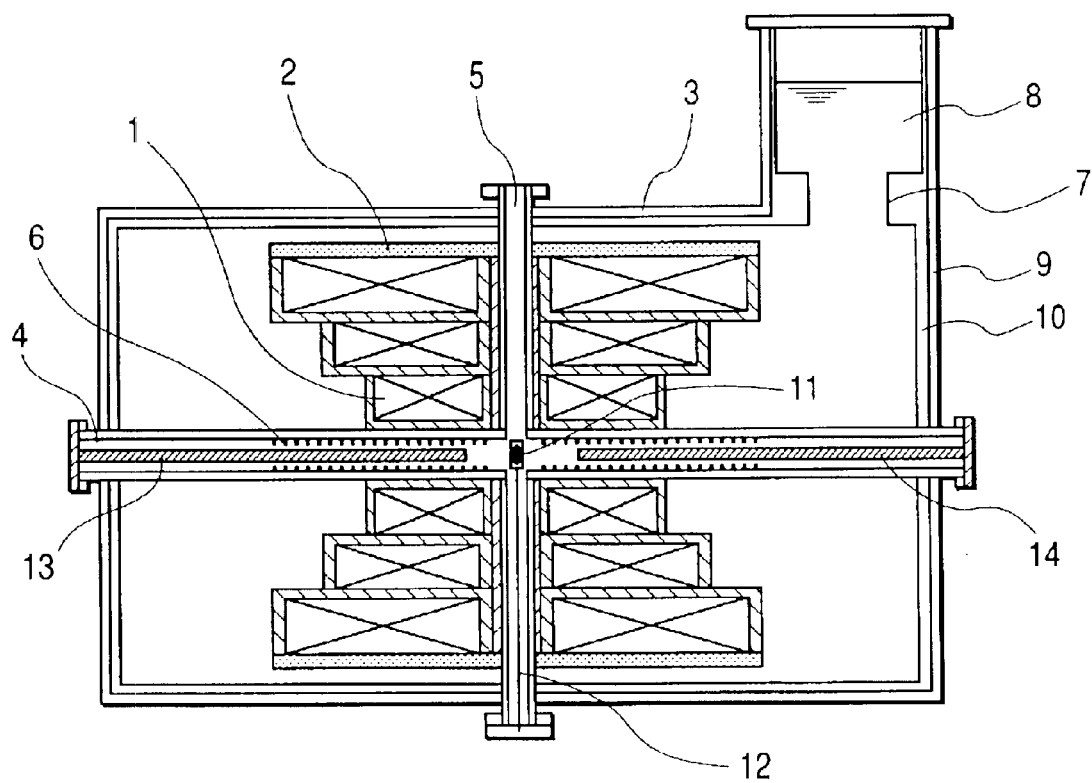
FIG. 4 is a sectional view illustrating the basic constitution of the NMR analyzer according to Embodiment 4 of the invention.

FIG. 4 is a sectional view illustrating the constitution of the NMR analyzer according to Embodiment 4. In this Embodiment 4, an electromagnetic wave detection system 14 is further arranged in Embodiment 3. In Embodiment 3, the effect of the electromagnetic wave irradiation is measured by the NMR analysis. In this Embodiment 4, on the other hand, the absorption spectra of electromagnetic waves and the intensities thereof are measured by the electromagnetic detection system 14 in parallel with the NMR analysis.

It is meaningful to select a transparent vessel material for the NMR probe and the sample chamber so that the electromagnetic waves directly arrive at the sample, and to form a gap in the NMR probe coil to facilitate the transmission of the electromagnetic waves.

According to the invention as described above, there is provided an NMR analyzer offering excellence in the installation and operability, and featuring compactness and high sensitivity.

What is claimed is:

1. An NMR analyzer comprising:
    a split-type multi-layer cylindrical superconducting coil system horizontally arranged in a cryostat, said split-type multi-layer cylindrical superconducting coil system including a gap,
    a first space formed penetrating through the split-type multi-layer cylindrical superconducting coil system, and
    a second space formed in the gap.

2. The NMR analyzer according to claim 1, wherein a ratio of the maximum magnetic field exposure to the magnet or coil to the central magnetic field is not larger than 1.3.

3. The NMR analyzer according to claim 1, further comprising a shim coil arranged in said second space.

4. An NMR analyzer wherein a first room-temperature space is formed penetrating through a cryostat along a center axis of a split-type multi-layer cylindrical superconducting coil system which has a ratio of the maximum magnetic field exposure to the magnet or coil to the central magnetic field of not larger than 1.3 and is horizontally arranged such that the center axis of the coil is in the horizontal direction, a room-temperature shim coil system is arranged in said first room-temperature space to improve the homogeneity of the magnetic field, a second room-temperature space is formed penetrating through the cryostat and passing through the center of a gap in the vertical direction, and a sample to be measured and an NMR probe having a solenoid-type probe coil are inserted in said second room-temperature space.

5. The NMR analyzer according to claim 4, wherein the third room-temperature space is provided with a system for irradiating electromagnetic waves having wavelengths of not larger than 0.1 mm, or with a system for irradiating electromagnetic waves having wavelengths of not larger than 0.1 mm and with an electromagnetic wave detection system.

6. The NMR analyzer according to claim 5, wherein the electromagnetic waves are any one kind of, or a plurality of kinds of, far infrared rays, infrared rays, visible rays, ultraviolet rays, X-rays and γ-rays.

7. An NMR analyzer wherein a first room-temperature space is formed penetrating through a cryostat along a center axis of a split-type multi-layer cylindrical superconducting coil system which has a ratio of the maximum magnetic field exposure to the magnet or coil to the central magnetic field of not larger than 1.3 and is horizontally arranged such that the center axis of the coil is in the horizontal direction, a room-temperature shim coil system is arranged in said first room-temperature space to improve the homogeneity of the magnetic field, a second room-temperature space is formed penetrating through the cryostat and passing through the center of a gap in the vertical direction, a sample to be measured is inserted in said second room-temperature space, a third room-temperature space is formed penetrating through the cryostat and intersecting said first room-temperature space at right angles thereto, and an NMR probe having a solenoid-type probe coil is arranged in said space.

8. The NMR analyzer according to any one of claims 4, 7, and 5, wherein the magnetic field at the center of the coil is not smaller than 11.5 T.

9. The NMR analyzer according to claims 4, 7, and 5, wherein the overall height of the apparatus is not larger than 2.0 m.

10. The NMR analyzer according to any one of claims 4, 7, 5, and 6, wherein the split-type multi-layer cylindrical superconducting coil system is horizontally arranged in a manner that the center axis of the coil thereof is in the horizontal direction, and wherein the distance between the floor surface and the center axis of the coil is not larger than 1.5 m.

* * * * *